United States Patent
Bouche et al.

(10) Patent No.: US 7,737,804 B2
(45) Date of Patent: Jun. 15, 2010

(54) SUPPORT FOR ACOUSTIC RESONATOR AND CORRESPONDING INTEGRATED CIRCUIT

(75) Inventors: Guillaume Bouche, Grenoble (FR); Guy Parat, Claix (FR)

(73) Assignees: STMicroelectronics S.A., Montrouge (FR); Commissariat a l'Energie Atomique, Paris (FR)

( * ) Notice: Subject to any disclaimer, the term of this patent is extended or adjusted under 35 U.S.C. 154(b) by 438 days.

(21) Appl. No.: 11/511,082

(22) Filed: Aug. 28, 2006

(65) Prior Publication Data
US 2007/0152777 A1    Jul. 5, 2007

(30) Foreign Application Priority Data
Sep. 5, 2005    (FR)    ................................... 05 09050

(51) Int. Cl.
*H03H 9/00*    (2006.01)
(52) U.S. Cl. ................... 333/187; 310/335; 257/415; 257/690; 257/698; 257/734; 257/774
(58) Field of Classification Search ......... 333/186–202; 310/335; 257/415, 690, 698, 734, 774
See application file for complete search history.

(56) References Cited

U.S. PATENT DOCUMENTS

| | | | | |
|---|---|---|---|---|
| 3,422,371 | A | | 1/1969 | Poirier et al. |
| 4,651,411 | A | * | 3/1987 | Konaka et al. ............... 438/296 |
| 5,873,154 | A | * | 2/1999 | Ylilammi et al. ........... 29/25.35 |
| 5,940,036 | A | * | 8/1999 | Oliver et al. .......... 343/700 MS |
| 6,297,515 | B1 | * | 10/2001 | Yuan ............................... 257/9 |
| 6,313,518 | B1 | * | 11/2001 | Ahn et al. .................... 257/632 |
| 6,445,254 | B1 | * | 9/2002 | Shibuya et al. ................ 331/68 |
| 6,509,813 | B2 | * | 1/2003 | Ella et al. .................... 333/187 |
| 6,542,054 | B2 | * | 4/2003 | Aigner et al. ............... 333/187 |
| 6,670,866 | B2 | * | 12/2003 | Ella et al. .................... 333/133 |
| 6,720,844 | B1 | * | 4/2004 | Lakin .......................... 333/189 |
| 6,744,090 | B2 | * | 6/2004 | Kim ............................. 257/301 |
| 6,927,649 | B2 | * | 8/2005 | Metzger et al. ............. 333/133 |
| 6,963,257 | B2 | * | 11/2005 | Ella et al. .................... 333/133 |
| 7,151,310 | B2 | * | 12/2006 | Nakano ....................... 257/700 |
| 7,212,081 | B2 | * | 5/2007 | Tada et al .................... 333/186 |

(Continued)

FOREIGN PATENT DOCUMENTS

EP    1 158 671   A3    11/2001

(Continued)

OTHER PUBLICATIONS

Patent Abstracts of Japan, vol. 2003, No. 12, Dec. 5, 2003; and JP 2004 187204 A, Sony Corp., Jul. 2, 2004.

(Continued)

*Primary Examiner*—Rexford N Barnie
*Assistant Examiner*—Matthew C Tabler
(74) *Attorney, Agent, or Firm*—Gardere Wynne Sewell LLP

(57) ABSTRACT

An integrated circuit includes at least one interconnection level and an acoustic resonator provided with an active element and a support. The includes at least one bilayer assembly having a layer of high acoustic impedance material and a layer of low acoustic impedance material. The support further includes a protruding element arranged on a metallization level of the interconnection level, making it possible to produce an electrical contact between an interconnection level and the active element of the acoustic resonator.

19 Claims, 9 Drawing Sheets

U.S. PATENT DOCUMENTS

| | | | |
|---|---|---|---|
| 7,248,131 B2* | 7/2007 | Fazzio et al. | 333/187 |
| 7,301,255 B2* | 11/2007 | Ito et al. | 310/313 R |
| 7,304,377 B2* | 12/2007 | Nakano | 257/700 |
| 7,385,334 B1* | 6/2008 | Olsson et al. | 310/322 |
| 7,443,270 B2* | 10/2008 | Motai | 333/187 |
| 7,456,707 B2* | 11/2008 | Tsurumi et al. | 333/187 |
| 7,501,068 B2* | 3/2009 | Kanda et al. | 216/2 |
| 2001/0028285 A1* | 10/2001 | Klee et al. | 333/188 |
| 2002/0093398 A1* | 7/2002 | Ella et al. | 333/187 |
| 2002/0172766 A1* | 11/2002 | Laxman et al. | 427/255.28 |
| 2003/0058064 A1* | 3/2003 | Nakano | 333/133 |
| 2004/0124952 A1* | 7/2004 | Tikka | 333/189 |
| 2004/0140870 A1* | 7/2004 | Kishimoto | 333/187 |
| 2004/0253828 A1* | 12/2004 | Ozawa et al. | 438/710 |
| 2005/0001698 A1* | 1/2005 | Bouche et al. | 333/191 |
| 2005/0012570 A1* | 1/2005 | Korden et al. | 333/189 |
| 2005/0012571 A1* | 1/2005 | Song et al. | 333/192 |
| 2005/0023931 A1* | 2/2005 | Bouche et al. | 310/327 |
| 2005/0023932 A1* | 2/2005 | Inoue et al. | 310/327 |
| 2005/0030127 A1* | 2/2005 | Loebl et al. | 333/187 |
| 2005/0057323 A1* | 3/2005 | Kando | 333/141 |
| 2005/0062558 A1* | 3/2005 | Sunwoo et al. | 333/133 |
| 2005/0093399 A1 | 5/2005 | Inoue | |
| 2005/0093659 A1* | 5/2005 | Larson et al. | 333/191 |
| 2005/0128027 A1* | 6/2005 | Song et al. | 333/133 |
| 2005/0168104 A1* | 8/2005 | Bouche et al. | 310/324 |
| 2005/0285700 A1* | 12/2005 | Koga et al. | 333/133 |
| 2007/0152777 A1* | 7/2007 | Bouche et al. | 333/187 |

FOREIGN PATENT DOCUMENTS

| | | |
|---|---|---|
| JP | 02 101617 | 4/1990 |
| JP | 9 275323 | 10/1997 |
| JP | 200035372 | 12/2000 |
| WO | WO 2004051848 A1 | 6/2004 |

OTHER PUBLICATIONS

Elbrecht., et al., "Integration of Bulk Acoustic Wave Filters: Concepts and Trends," Microwave Symposium Digest, 2004 IEEE MTT-S International, Fort Worth, TX, USA, Jun. 6-11, 2004, Piscataway, NJ, USA, IEEE, Jun. 6, 2004, pp. 395-398; XP010727323; ISBN: -7803-8331-1.

Dubois, et al., "Integration of High-Q BAW Resonators and Filters Above IC," 2005 IEEE International Sold-State Circuit Conference, ISSCC 2005, Session 21, TD: RF Trends Above-IC Integration and MM-Wave, 21.2; 0-7803-8904-2.

Preliminary French Search Report, FR 05 09050, dated Jun. 12, 2006.

* cited by examiner

SUPPORT FOR ACOUSTIC RESONATOR AND CORRESPONDING INTEGRATED CIRCUIT

PRIORITY CLAIM

The present application claims priority from French Application for Patent No. 05 09050 filed Sep. 5, 2005, the disclosure of which is hereby incorporated by reference.

BACKGROUND OF THE INVENTION

1. Technical Field of the Invention

The present invention relates to integrated circuits, and more particularly integrated circuits comprising one or more acoustic resonators, preferably piezoelectric acoustic resonators, which can be used in signal processing applications, for example being used in a filtering function.

2. Description of Related Art

It is known in the prior art to produce acoustic or piezoelectric resonators arranged on interconnection levels or in interconnection levels. Conventionally, the acoustic resonators generally comprise an active element and a support which constitutes an acoustic mirror. Such resonators are thus secured to the integrated circuit while having to be acoustically or mechanically insulated from it. To this end, the supports for acoustic resonators make it possible to produce this insulation. In order to produce such insulation, a plurality of structures of a support for acoustic resonators have thus been envisaged.

In particular, one of these structures consists in producing a support comprising at least one bilayer assembly comprising a layer of high acoustic impedance material and a layer of low acoustic impedance material produced with the aid of a material with low electrical permittivity, as described in published PCT Patent Application WO 2004/051848, the disclosure of which is hereby incorporated by reference. In this way, the greater the difference in acoustic impedance is between the materials of the layers of the support, the more the acoustic waves liable to propagate in the integrated circuit will be reflected. The propagation of these waves is thus minimized in the integrated circuit.

Another possible structure consists in producing a support comprising an alternating sequence of at least two insulating layers with low acoustic impedance and at least two metal layers with high acoustic impedance stacked on one another on a substrate, as described in U.S. Pat. No. 6,542,054, the disclosure of which is hereby incorporated by reference. The metal layers are contained in auxiliary layers in order to avoid covering all the surface of the insulating layers, so as to obtain a support which has a planar surface. No indication is given about producing the connection of such an acoustic resonator within the integrated circuit.

Another of these structures consists in producing a certain number of acoustic resonators connected together via their electrodes as well as via a conductive layer in order to improve the filtering function of an integrated circuit, as described in United States Patent Application Publication No. 2004/0124952, the disclosure of which is hereby incorporated by reference. This conductive layer acts so as to electrically couple the entire architecture. No indication is given about producing the connection of such an acoustic resonator within the integrated circuit.

Another structure which is also possible consists in producing an acoustic resonator support which consists of stacking an air-filled cavity, which may be obtained by chemical or plasma etching, and a silicon nitride membrane which is arranged on such a cavity. The silicon nitride layer thus surrounds the entire air-filled cavity and lies directly in contact with the active element of the acoustic resonator. The air-filled cavity may be supported by a silicon oxide layer. In other words, this cavity is sandwiched between a silicon oxide layer and the silicon nitride membrane. There is also a passivation layer consisting of a dielectric material on top of the acoustic resonator, which is used to adjust the resonant frequencies of the acoustic resonators.

In particular, the resonant frequencies of the acoustic resonators are adjusted to the same frequency by a step of thinning this passivation layer, in order to obtain a satisfactory filtering function of the integrated circuit. This thinning step consists in abrading the surface of the passivation layer. Problems of bonding the membrane to the air-filled cavity may arise during this method, however, thus making the resonator non-functional. In general, such an architecture makes it difficult to carry out a method involving all sorts of liquids because of the membrane bonding problems. This architecture therefore makes it difficult to adjust the resonant frequencies of the acoustic resonators, and likewise does not make it possible to produce a solid membrane.

In order to produce such an architecture, it is a furthermore preferable to planarize the walls of the air-filled cavity in order to avoid the formation of a slot within the piezoelectric layer.

Such an architecture is described particularly in the scientific articles: "Integration of Bulk Acoustic Wave Filters: Concept and Trends," by L. Elbrecht, R. Aigner et al., and "Integration of High-Q BAW Resonators and Filters Above IC," by Marc-Alexandre Dubois et al., the disclosures of which are hereby incorporated by reference In view of the preceding, there is a need in the art to produce an acoustic resonator which is connected to the rest of the integrated circuit and whose architecture has minimal roughness and makes a thinning step possible for adjusting the resonant frequencies of the acoustic resonator.

SUMMARY OF THE INVENTION

An embodiment provides an integrated circuit comprising at least one interconnection level and an acoustic resonator provided with an active element and with a support. The support comprises at least one bilayer assembly comprising a layer of high acoustic impedance material and a layer of low acoustic impedance material. The support further comprises a protruding element arranged above a metallization level of the interconnection level, making it possible to produce an electrical contact between the interconnection level and the active element of the acoustic resonator.

An acoustic resonator is thus obtained whose support comprises integrated interconnections and whose architecture has minimal roughness. Furthermore, a thinning step can be carried out in order to adjust the filtering function of the integrated circuit. This thinning step may comprise abrading a part of the surface of the upper electrode of the active element of the resonator or a passivation layer consisting of a dielectric material covering the acoustic resonator.

Advantageously, the protruding element may form an electrical contact between the metallization level of the interconnection level and a lower electrode of the active element of the acoustic resonator.

Advantageously, the protruding element may form an electrical contact between the metallization level of the interconnection level and an upper electrode of the acoustic resonator.

In one embodiment of the invention, the protruding element comprises a metal block.

According to another embodiment, a method is provided for fabricating an integrated circuit. A protruding element is produced arranged above a metallization level of the interconnection level. At least one bilayer assembly is produced comprising a layer of high acoustic impedance material and a layer of low acoustic impedance material.

The order in which the protruding element and the bilayer assembly are produced in the method is arbitrary.

The method makes it possible to obtain an acoustic resonator whose support comprises integrated interconnections, which makes it possible to minimize the number of additional steps consisting in electrically connecting such a resonator to the rest of the integrated circuit.

According to another embodiment, a layer of high acoustic impedance material is formed after the protruding element is produced so as to cover at least the protruding element. A material is deposited for protecting parts of the layer not covering the protruding element during the removal of a part of the layer covering the protruding element. Also, a layer of low acoustic impedance material layer is formed.

The method makes it possible to obtain an acoustic resonator support in which the thicknesses of the high and low acoustic impedance layers are well controlled during the various steps of the method. In particular, the deposition of an organic material on the parts of the high acoustic impedance layer not covering the protruding element advantageously makes it possible to protect them and dimension them with a thickness of the order of one quarter of the wavelength.

According to another characteristic of the invention, the protruding element may be produced from an organic material which is removed after the production of the bilayer assembly and which is replaced by a protruding element comprising metal.

According to another characteristic of the invention, the protruding element is produced after the formation of the bilayer assembly.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 1:
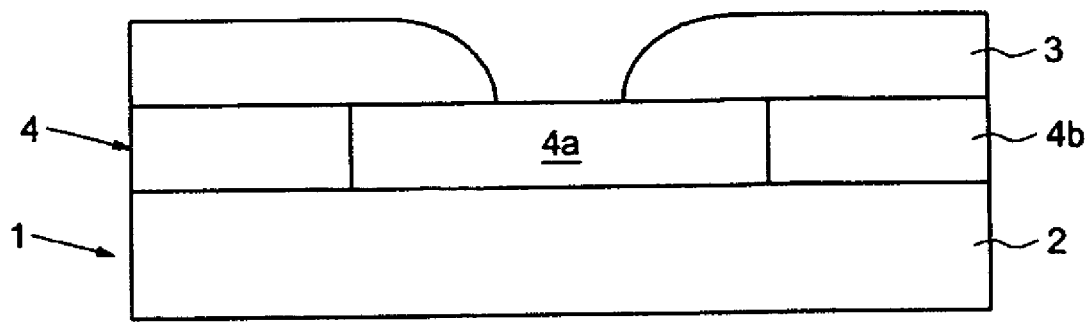
FIGS. 1 to 9 schematically illustrate the successive steps of an embodiment of a method for fabricating an acoustic resonator provided with an active element and a support.

In FIG. 1, an interconnection level 1 of an integrated circuit comprises a dielectric layer 2, for example of silicon oxide or SiOC, and a metallization level 4 comprising a conductive line 4a, preferably of copper, produced for example by electrolytic deposition, and an insulating zone 4b comprising a dielectric material. The metallization level 4 is arranged on the dielectric layer 2 and may have a thickness of the order of a few μm. A thick photosensitive layer 3 of a material having a low electrical permittivity, preferably less than 3, such as in particular benzocyclobutene, was subsequently deposited on the metallization level 4 and was chemically etched in order to form a window so as to uncover a part of the upper surface of the conductive line 4a. The conductive line 4a thus comprises an exposed part and a part covered by the photosensitive layer 3.

Figure 2:
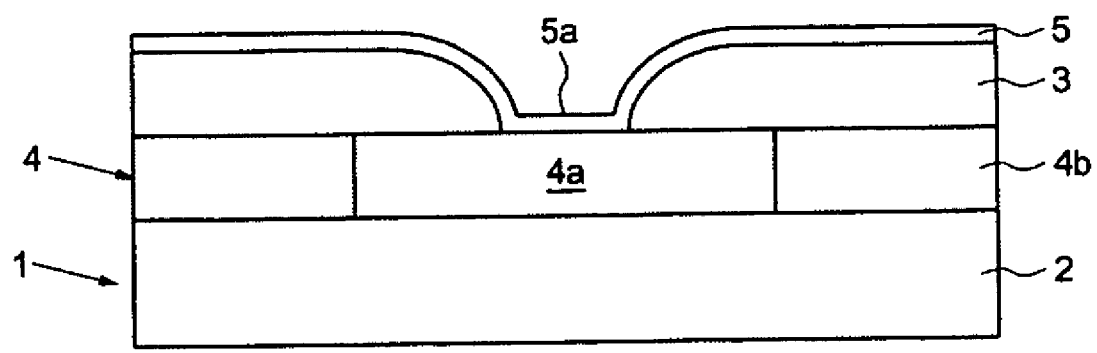

A conductive layer 5 is subsequently deposited on the entire interconnection level 1 so as to cover both the photosensitive layer 3 and the upper surface of the conductive line 4a of the metallization level 4, as illustrated in FIG. 2. The conductive-layer 5 comprises an upper surface 5a. The conductive layer 5 may in particular be copper deposited by cathodic sputtering or by MOCVD (metal organic chemical vapor deposition). The layer 5 may have a thickness of less than 200 nm.

Figure 3:
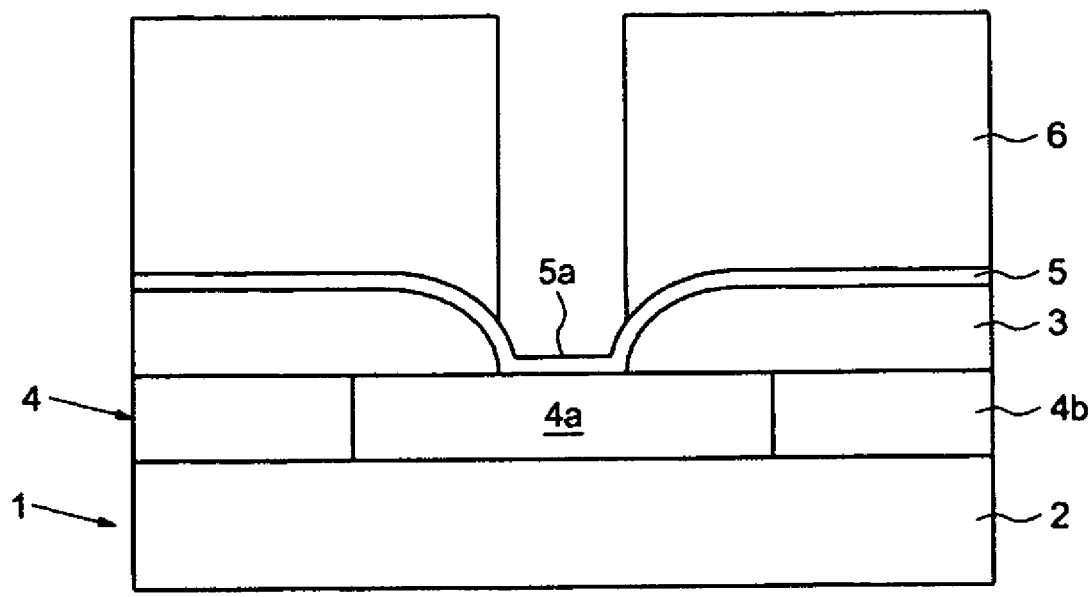

A photosensitive resin layer 6 is subsequently deposited conventionally on the entire interconnection level 1 so as to cover the conductive layer 5. The resin 6 is cured, preferably at a temperature of about 110° C. A trench is subsequently produced in the resin 6 by photolithography then by developing as far as the upper surface 5a of the conductive layer 5, as illustrated in FIG. 3.

Figure 4:
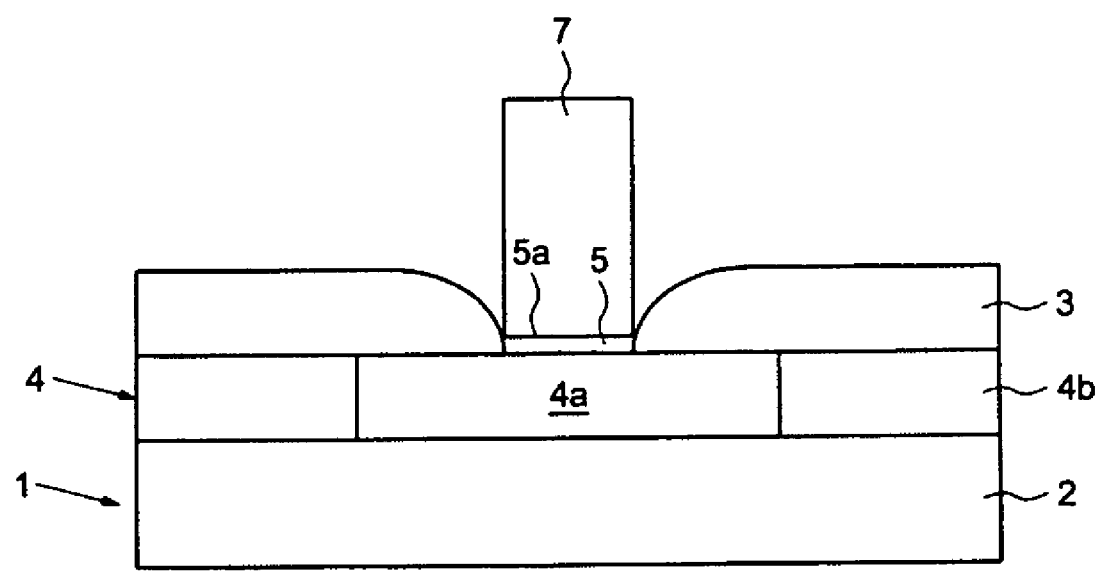

A metal block 7, preferably of copper, is produced by electrodeposition. The conductive layer 5 has the advantage of supplying the current within the resin 6 in order to carry out such electrodeposition. The resin 6 is removed by stripping, then chemical etching is carried out in order to remove the conductive layer 5 covering the layer 3. The metal block 7 is thus arranged above the upper surface of the conductive line 4a of the metallization level 4, as illustrated in FIG. 4. In particular, the block 7 is arranged on the upper surface 5a of the conductive layer 5.

Figure 5:
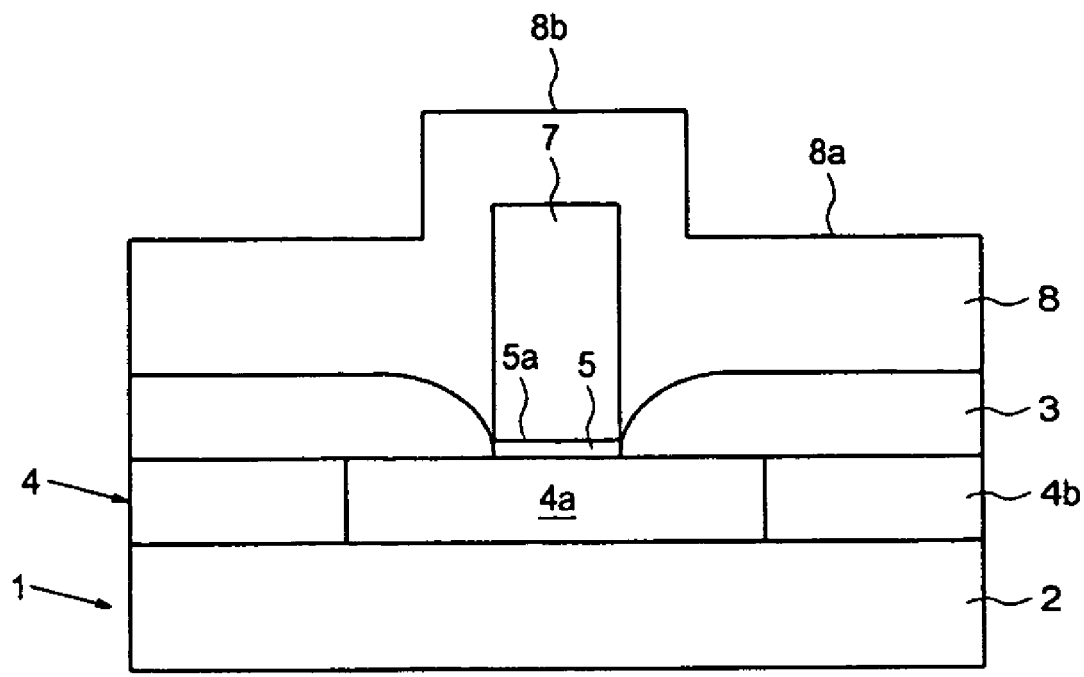

As indicated in FIG. 5, the high acoustic impedance layer 8 is deposited so that one part 8b covers the metal block 7 and the parts 8a cover the photosensitive layer 3. The high acoustic impedance layer 8 may be produced from a dielectric material such as amorphous aluminum nitride or silicon nitride.

Figure 6:
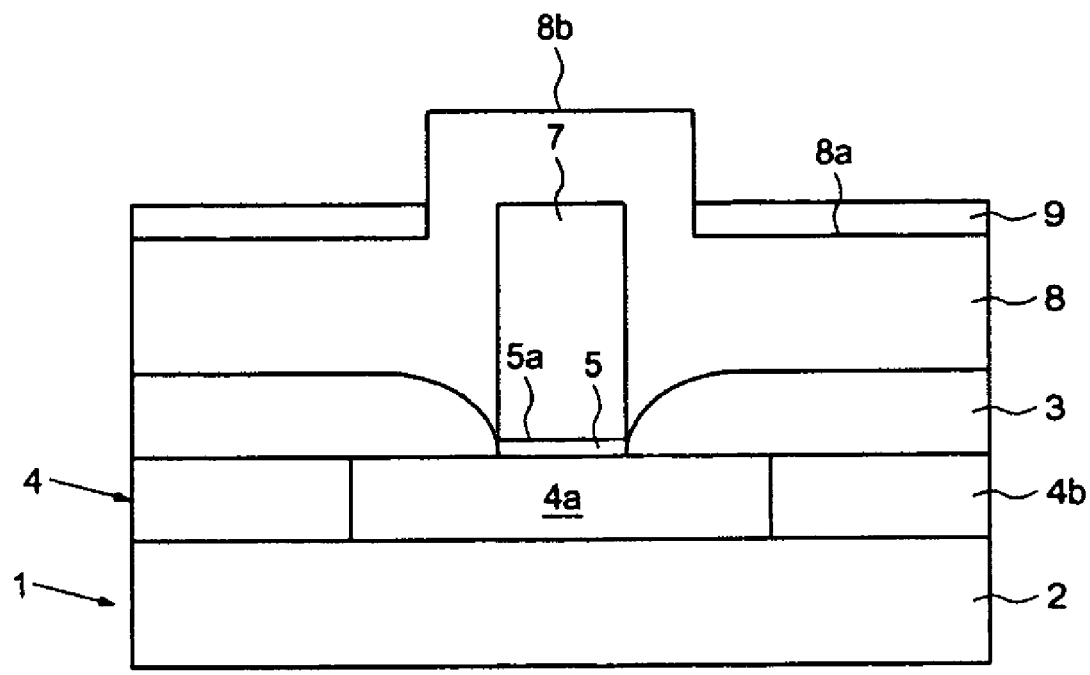

A layer 9 of an organic material, for example a polymer, preferably a polyimide, is deposited on the high acoustic impedance layer 8. The layer 9 is subsequently removed level with the part 8b of the layer 8 by a photolithography step, thus covering the parts 8a as illustrated in FIG. 6. The layer 9 is sequentially cured, preferably at a temperature of 350° C. in order to promote the polymerization. It should be noted that the layer 9 may also be removed level with the part 8b of the layer 8 by chemical mechanical polishing after curing the layer 9.

Figure 7:
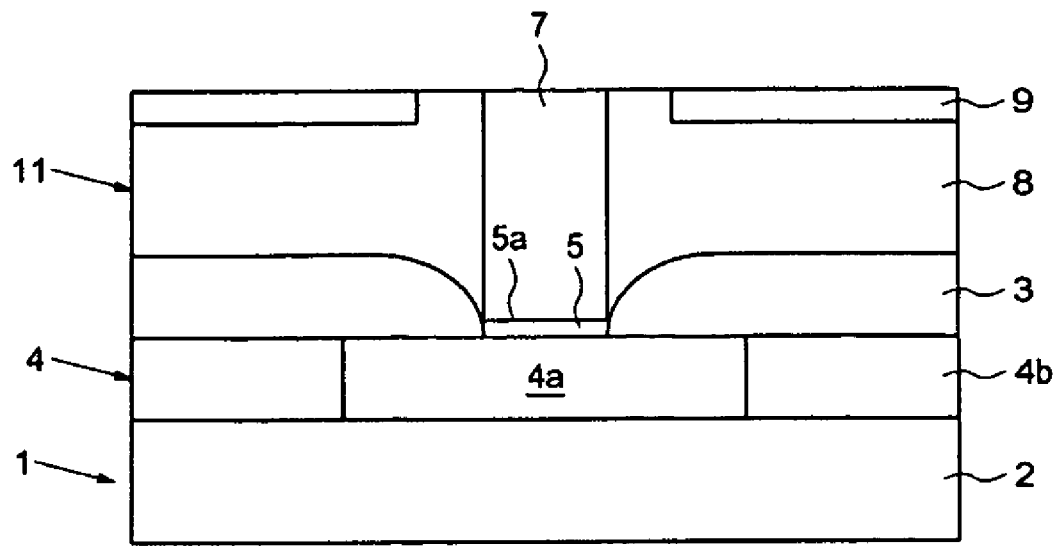

The part 8b of the high acoustic impedance layer 8 is subsequently removed by chemical mechanical polishing, as illustrated in FIG. 7. This polishing is carried out so as not to damage the layer 9 or the upper surface of the metal block 7. The layer 9 advantageously makes it possible to protect the parts 8a of the high acoustic impedance layer 8 during the chemical mechanical polishing.

The layer 9 is subsequently removed by selective oxidizing etching so as not to deteriorate the block 7 or the layer 8. Furthermore chemical mechanical polishing may also be carried out in order to reduce the angles at the edges of the metal block 7 and in order to reduce the possible roughness of the high acoustic impedance layer 8. This chemical mechanical polishing is carried out so as not to damage the surface of the layer 8.

Figure 8:
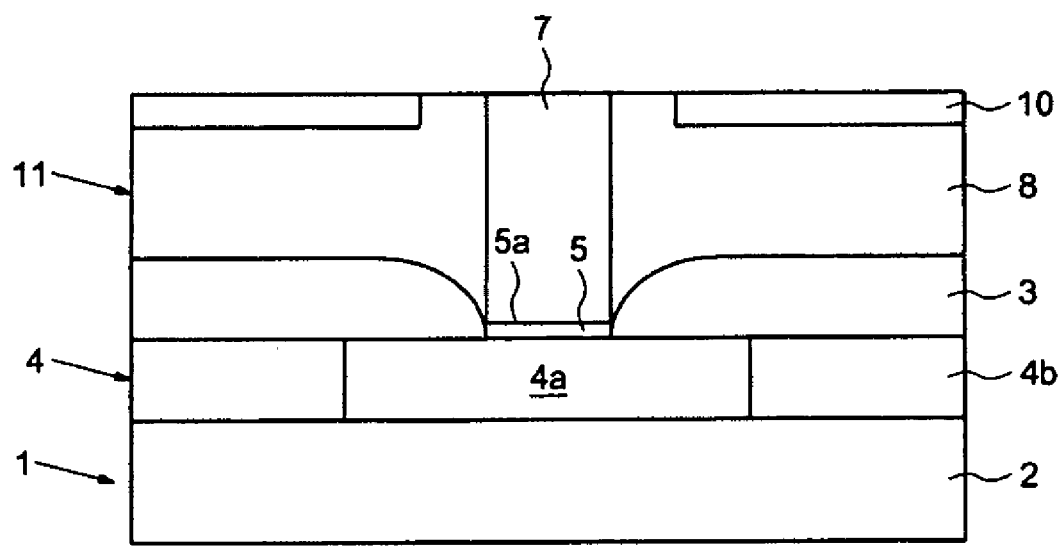

A low acoustic impedance layer 10 is deposited on the high acoustic impedance layer 8 in order to produce the rest of the support 11 of the acoustic resonator. Photolithography and etching are carried out in order to remove a part of the low acoustic impedance layer 10 so as to uncover the upper part of the metal block 7, as illustrated in FIG. 8. The low acoustic impedance layer 10 may be produced from a material with low electrical permittivity owing to the correspondence between low electrical permittivity and low acoustic impedance. The permittivity of the material of the layer 10 may be less than 4. The electrical permittivity of the layer 10 may preferably be less than 3, for example a dielectric material with a permittivity of the order of 2.9 as often used for a dielectric layer in the active zones of the substrate or in an interconnection level. For example, SiOC or a material based on SiOC may be selected. It may be advantageous to produce the layer 10 from a material with an ultralow permittivity of less than 2.5, for example of the order of 2. To this end, the layer 10 may be produced from porous SiOC or on the basis of such a material.

Figure 9:
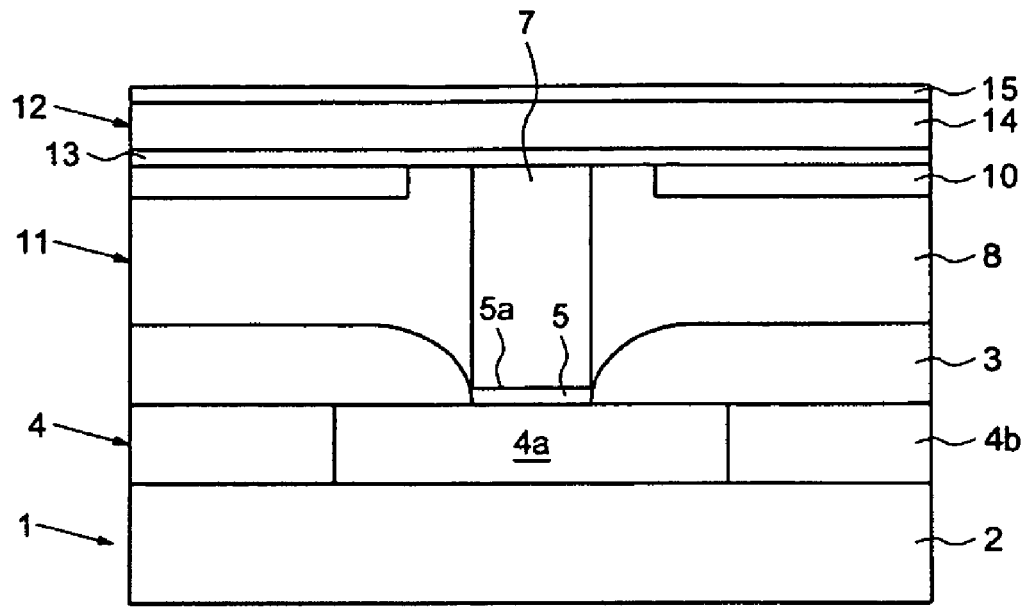

The active element 12 of the acoustic resonator is subsequently produced conventionally, as illustrated in FIG. 9. The active element 12 comprises three main layers in the form of a lower electrode 13, a piezoelectric layer 14 and an upper electrode 15. The lower electrode 13 thus lies in contact with the upper surface of the metal block 7, in order to form an electrical contact between the interconnection level 1 and the active element 12. The electrodes 13 and 15 are produced from a conductive material, for example aluminum, copper, platinum, molybdenum, nickel, titanium, niobium, silver, gold, tantalum, lanthanum etc. The piezoelectric layer 14 arranged between the electrodes 13 and 15 may be produced in particular from crystalline aluminum nitride, zinc oxide, zinc sulfide, ceramic such as LiTaO, PbTiO, PbZrTi, $KbO_3$ or alternatively containing lanthanum, etc. The piezoelectric layer 14 may have a thickness of a few μm, for example 2.4 μm, and the electrodes 13 and 15 may have a thickness much less than that of the piezoelectric layer 14, for example 0.1 μm.

Figure 10:
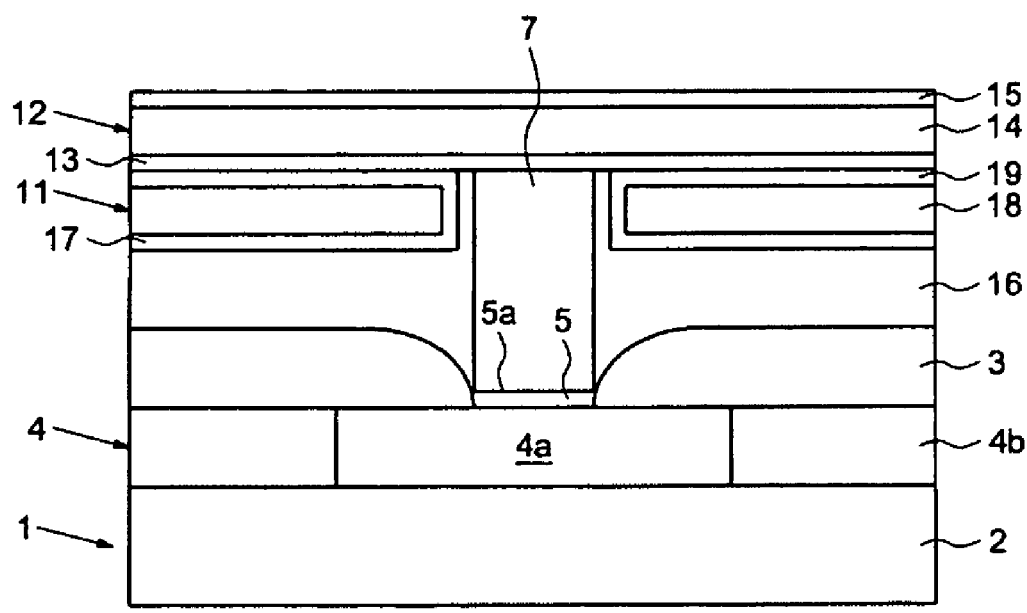
FIGS. 10 and 11 illustrate a schematic view of an acoustic resonator according to one embodiment.

The support 11 may also comprise an additional bilayer assembly. As indicated in FIG. 10, the support 11 may thus comprise two bilayer assemblies each comprising a high acoustic impedance layer 16 or 18 and a low acoustic impedance layer 17 or 19.

The support 11 may also comprise an odd number of layers in the event that a first low acoustic impedance layer is formed under one or more bilayers.

Figure 11:
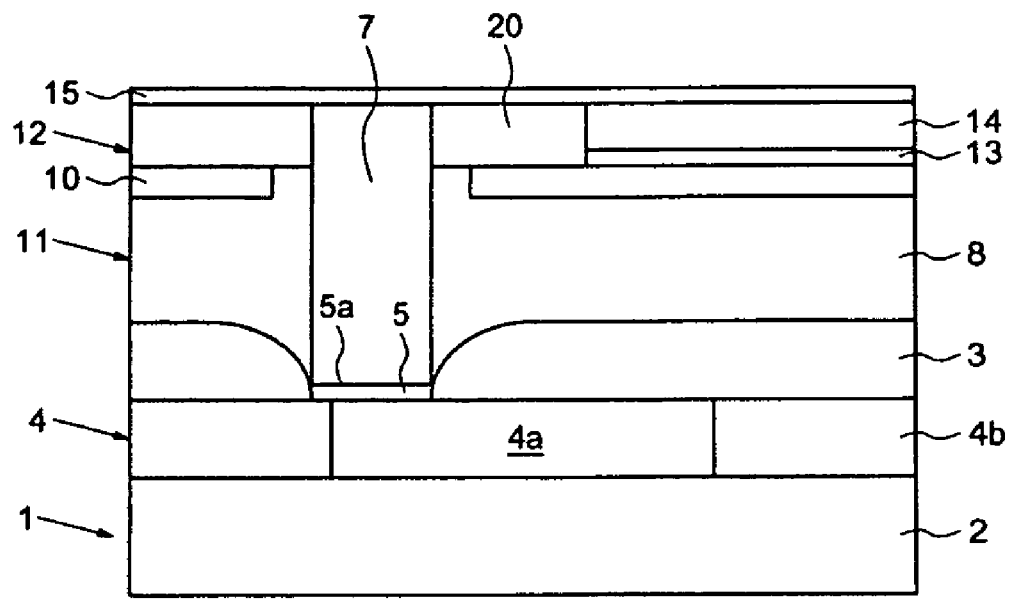

In another embodiment, the metal block 7 forms an electrical contact between the metallization level 4 of the interconnection level 1 and an upper electrode 15, as represented in FIG. 11. In this embodiment, the lower electrode 13 and a dielectric layer 20 partly lie on top of the low acoustic impedance layer 10. The dielectric layer 20 is thus contained between the lower electrode 13 and the upper electrode 15, and is in contact with the metal block 7. The layer 20 may be made of silicon oxide or an organic layer such as polyimide.

Figure 12:
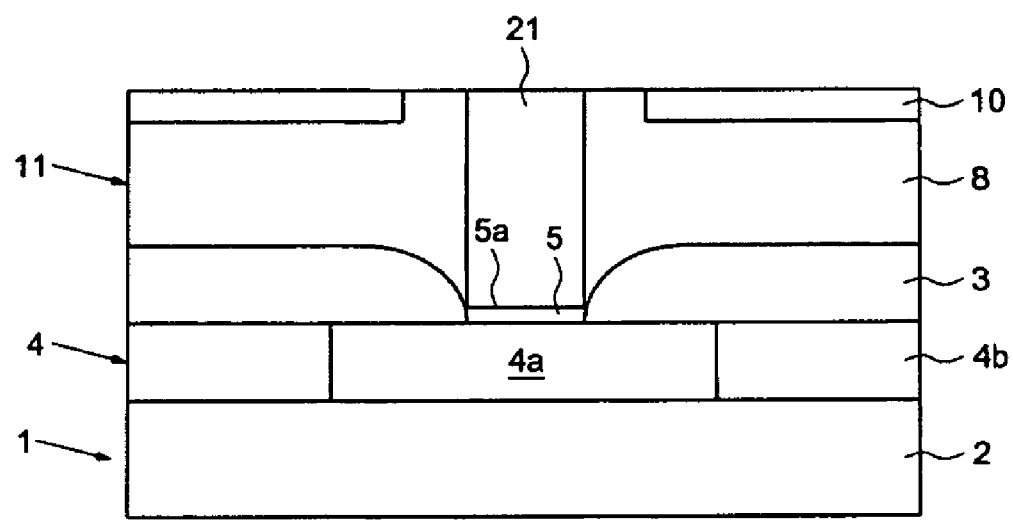
FIGS. 12 and 13 schematically represent a particular embodiment of an acoustic resonator.

In another preferred embodiment, the support 11 of an acoustic resonator may advantageously comprise a protruding element which may be a block comprising an organic material 21, as illustrated in FIG. 12.

Figure 13:
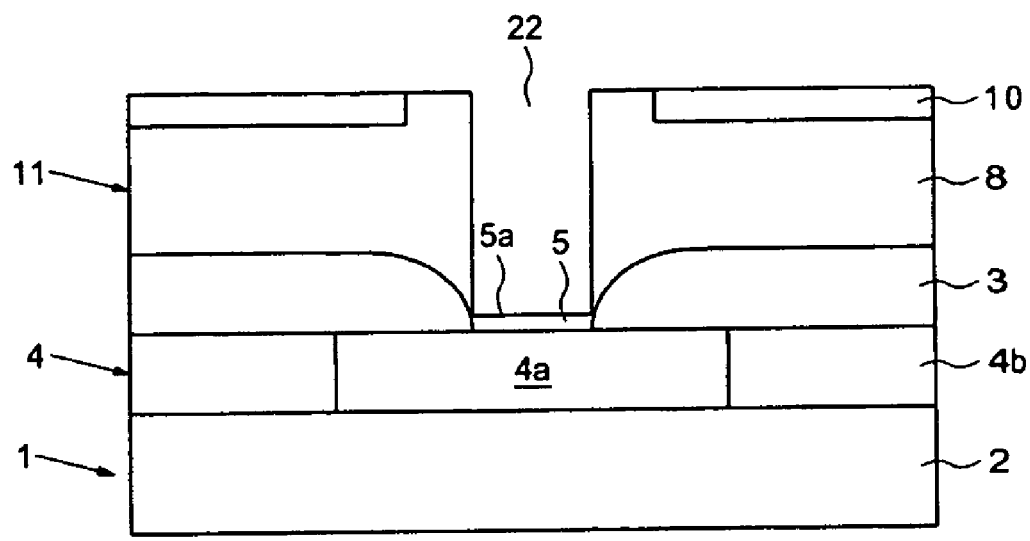

The block 21 is removed, preferably by oxidizing etching, before the production of the active element 12 of the acoustic resonator so as to leave a trench 22, as illustrated in FIG. 13. The selective etching of the block 21 makes it possible to avoid damaging the low acoustic impedance layer 10. The trench 22 is subsequently filled with a metal, preferably copper, so as to form a metal block. The active element 12 is subsequently produced in the same way as in the previous embodiments.

Figure 14:
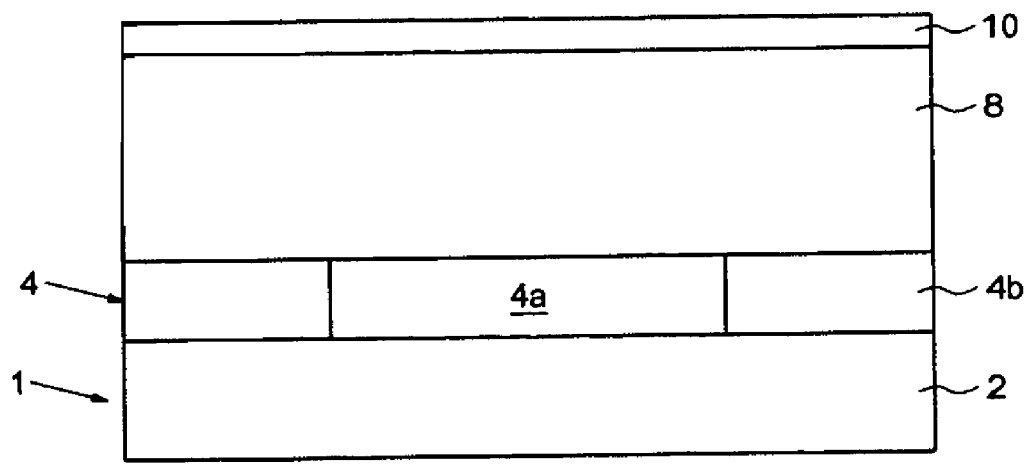
FIGS. 14 to 17 schematically illustrate another particular embodiment of an acoustic resonator.

According to another embodiment, the high acoustic impedance layer 8 may be arranged on the metallization level 4 of the interconnection level 1, and the low acoustic impedance layer 10 may lie on top of it as represented in FIG. 14. In other words, the high acoustic impedance layer 8 may be sandwiched between the metallization level 4 and the low acoustic impedance layer 10. As can be seen in this figure, the high acoustic impedance layer covers all the surface of the metallization level 4.

Figure 15:
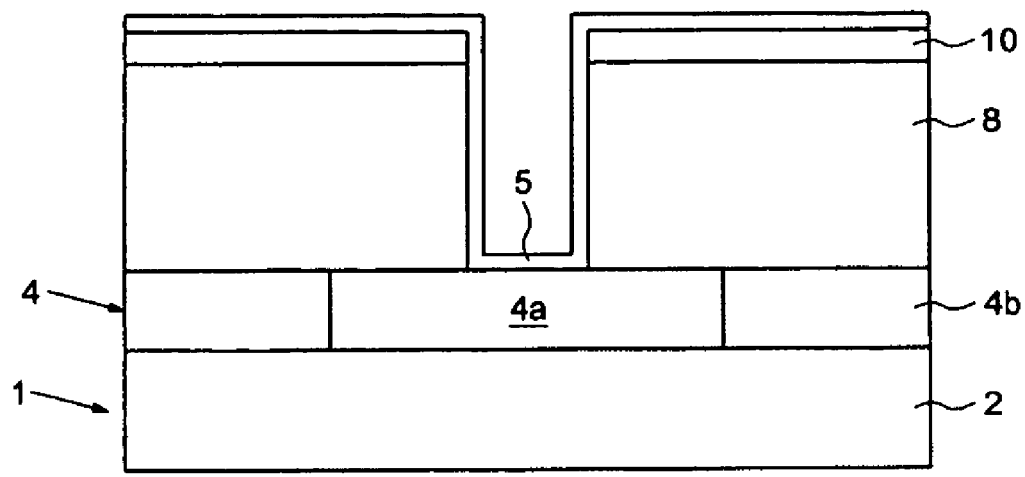

The high acoustic impedance layer 8 and the low acoustic impedance layer 10 are subsequently etched chemically as far as the upper surface of the conductive line 4a in order to form a trench or a via, as represented in FIG. 15. The upper surface of the conductive line then comprises an exposed part and a part covered by the high acoustic impedance layer 8.

As can be seen in this figure, a conductive layer 5 was subsequently deposited so as to cover the low acoustic impedance layer 10 and the conductive line 4a of the metallization level 4. The conductive layer 5 then covers the side walls as well as the bottom of the via. The conductive layer 5 may in particular be copper.

Figure 16:
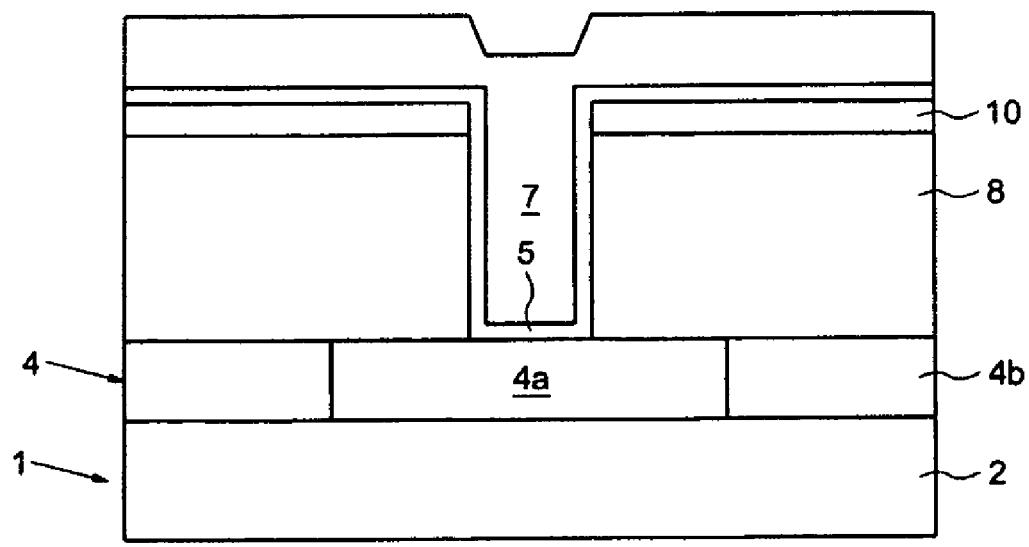

As shown by FIG. 16, a layer 7 of metal, preferably copper, is subsequently produced by electrodeposition so as to fill the via and cover the upper surface of the low acoustic impedance layers 10.

Figure 17:
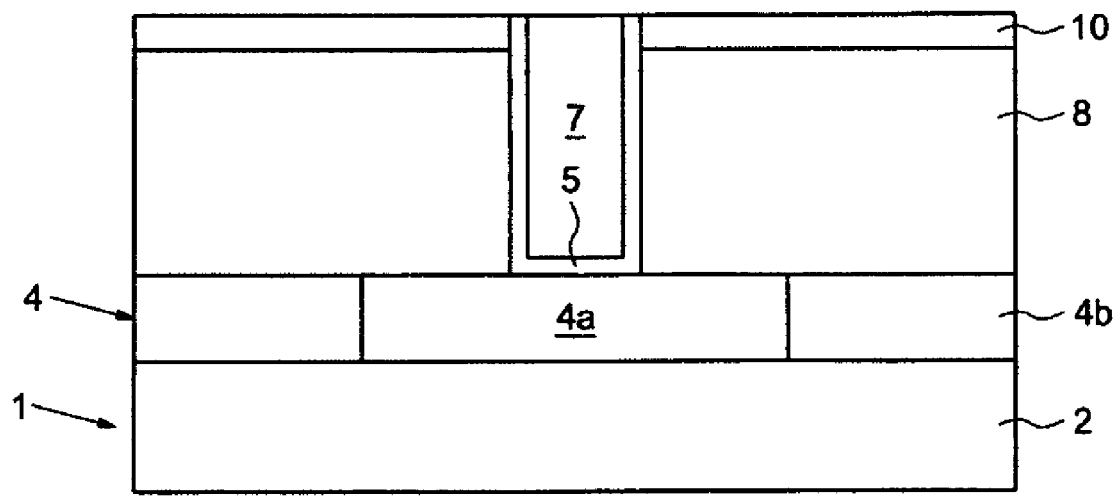

The parts of the layer 7 covering the low acoustic impedance layer 10 are subsequently removed by chemical mechanical polishing, as shown by FIG. 17. The parts of the conductive layer 5 covering the upper surface of the low acoustic impedance layers are removed by chemical etching.

A metal block 7 is thereby obtained, preferably of copper, which makes it possible to produce an electrical contact between the metallization level 4 of the interconnection level 1 and one of the electrodes of the active element 12 of the acoustic resonator.

In this way, it is possible to produce at the same time the metal block 7 as well as other components of the integrated circuit, such as the low electrical impedance lines in the metallization levels of the interconnections or passive components such as inductors.

Furthermore, the copper thickness used to produce the metal block 7 is approximately equal to 3 or 4 μm, which corresponds to the order of magnitude of the copper thickness which is used to produce the inductors.

The copper inductors are conventionally produced in an $SiO_2$ box.

On the basis of the embodiment described above, it is therefore possible to produce the dielectric layers of the acoustic resonator as well as the metal block 7 at the same time as the inductors and the dielectric box in which such inductors are produced.

As seen above, the protruding element 7 may preferably assume the form of a metal block, although it may also assume other types of closed shapes.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. An integrated circuit, comprising:
   at least one interconnection level; and
   an acoustic resonator provided with an active element disposed on a support;
   said support comprising at least one bilayer assembly including a layer of high acoustic impedance material and a layer of low acoustic impedance material;
   said support further comprising a protruding element arranged above a metallization level of the interconnection level and passing through the layer of high acoustic impedance material and layer of low acoustic impedance material of the bilayer assembly, making it possible to produce an electrical contact between the interconnection level and the active element of the acoustic resonator.

2. The integrated circuit according to claim 1, wherein the protruding element forms an electrical contact between the metallization level of the interconnection level and a lower electrode of the active element of the acoustic resonator.

3. The integrated circuit according to claim 1, wherein the protruding element forms an electrical contact between the metallization level of the interconnection level and an upper electrode of the acoustic resonator.

4. The integrated circuit according to claim 1, wherein the protruding element comprises a metal block.

5. The integrated circuit according to claim 1, further including a conductive layer between the metallization level and the protruding element.

6. The integrated circuit according to claim 1, further including a second bilayer assembly within the support.

7. An integrated circuit, comprising:
    at least one interconnection level;
    an acoustic resonator provided with an active element; and
    a support structure between the interconnection level and the active element of the acoustic resonator, the support structure comprising:
        at least one bilayer assembly including a layer of high acoustic impedance material and a layer of low acoustic impedance material; and
        a protruding conductive element passing through the layers of the bilayer assembly to electrically interconnect a metallization level within the interconnection level to the active element of the acoustic resonator.

8. The integrated circuit according to claim 7, wherein the protruding conductive element forms an electrical contact between the metallization level of the interconnection level and a lower electrode of the active element of the acoustic resonator.

9. The integrated circuit according to claim 7, wherein the protruding conductive element forms an electrical contact between the metallization level of the interconnection level and an upper electrode of the acoustic resonator.

10. The integrated circuit according to claim 7, wherein the protruding conductive element comprises a metal block.

11. The integrated circuit according to claim 7, further including a conductive layer between the metallization level and the protruding conductive element.

12. The integrated circuit according to claim 7, further including a second bilayer assembly within the support.

13. An integrated circuit, comprising:
    an acoustic resonator provided with an active element; and
    a structure supporting an underside of the active element of the acoustic resonator, said structure comprising:
        at least one bilayer assembly including a layer of high acoustic impedance material and a layer of low acoustic impedance material; and
        a protruding conductive element passing through the layer of high acoustic impedance material and the layer of low acoustic impedance material of the bilayer assembly to provide an electrical interconnection to the active element of the acoustic resonator.

14. The integrated circuit according to claim 13, wherein the protruding conductive element forms an electrical contact between a metallization level of an interconnection level and a lower electrode of the active element of the acoustic resonator.

15. The integrated circuit according to claim 14, further including a conductive layer between the metallization level and the protruding conductive element.

16. The integrated circuit according to claim 13, wherein the protruding conductive element forms an electrical contact between a metallization level of an interconnection level and an upper electrode of the acoustic resonator.

17. The integrated circuit according to claim 16, further including a conductive layer between the metallization level and the protruding conductive element.

18. The integrated circuit according to claim 13, wherein the protruding conductive element comprises a metal block.

19. The integrated circuit according to claim 13, further including a second bilayer assembly within the support.

* * * * *